United States Patent
Giefers

(10) Patent No.: US 10,085,355 B2
(45) Date of Patent: Sep. 25, 2018

(54) HOUSING MOUNTABLE ON A MOUNTING RAIL FOR RECEIVING AN ELECTRONICS MODULE

(71) Applicant: Phoenix Contact GmbH & Co. KG, Blomberg (DE)

(72) Inventor: Stefan Giefers, Horn-Bad Meinberg (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 15/415,900

(22) Filed: Jan. 26, 2017

(65) Prior Publication Data
US 2017/0215292 A1    Jul. 27, 2017

(30) Foreign Application Priority Data

Jan. 27, 2016 (DE) .......................... 10 2016 101 409

(51) Int. Cl.
*H05K 5/00* (2006.01)
*H05K 5/02* (2006.01)
(Continued)

(52) U.S. Cl.
CPC .......... *H05K 5/0217* (2013.01); *G06F 1/181* (2013.01); *H05K 5/0026* (2013.01);
(Continued)

(58) Field of Classification Search
None
See application file for complete search history.

(56) References Cited

U.S. PATENT DOCUMENTS 4,658,375 A * 4/1987 Onogi ................. H05K 7/1478
                                                     361/679.41
4,683,515 A * 7/1987 Beihoff ................. H02H 3/085
                                                     361/106
(Continued)

FOREIGN PATENT DOCUMENTS

CN     204291660 U    4/2015
DE      4434064 A1    3/1995
(Continued)

OTHER PUBLICATIONS

Hartmut Wendt Hard- & Softwareentwicklung, "How to install the Raspberry Pi in a control cabinet", Mar. 27, 2014, pp. 1-6.
(Continued)

*Primary Examiner* — Courtney Smith
*Assistant Examiner* — Rashen E Morrison
(74) *Attorney, Agent, or Firm* — Leydig, Voit & Mayer, Ltd.

(57) ABSTRACT

A housing mountable on a mounting rail includes an upper housing part which has two side walls, extending longitudinally in a longitudinal direction and spaced apart from one another in a transverse direction transverse to the longitudinal direction; and a receiving chamber, formed between the side walls, for receiving an electronics module, at least one of the side walls having a first opening via which a first electrical line is connectable to a first port of the electronics module. The upper housing part has a connection chamber which is offset in the longitudinal direction from the receiving chamber, is formed between the side walls, and is open to the receiving chamber such that a second electrical line is connectable to a second electrical port of the electronics module via the connection chamber.

20 Claims, 6 Drawing Sheets

(51) Int. Cl.
  *G06F 1/18* (2006.01)
  *H05K 5/03* (2006.01)
  *H05K 7/14* (2006.01)

(52) U.S. Cl.
  CPC ............ *H05K 5/0247* (2013.01); *H05K 5/03* (2013.01); *H05K 7/1468* (2013.01)

(56) References Cited

U.S. PATENT DOCUMENTS

| | | | | |
|---|---|---|---|---|
| 4,791,361 A | * | 12/1988 | Beihoff | G01R 15/205 |
| | | | | 324/117 H |
| 5,198,793 A | * | 3/1993 | Leveque | H05K 1/0284 |
| | | | | 200/522 |
| 5,383,793 A | * | 1/1995 | Hsu | H05K 7/1405 |
| | | | | 248/316.4 |
| 5,457,607 A | | 10/1995 | Carvalho | |
| 5,457,608 A | | 10/1995 | Scholder et al. | |
| 5,499,163 A | | 3/1996 | Sonntag et al. | |
| 5,510,759 A | * | 4/1996 | Gula | H01H 83/226 |
| | | | | 335/18 |
| 5,652,420 A | * | 7/1997 | Innes | H01H 71/02 |
| | | | | 200/307 |
| 5,793,270 A | * | 8/1998 | Beck | H01H 77/104 |
| | | | | 218/154 |
| 5,874,699 A | * | 2/1999 | Beck | H01H 71/501 |
| | | | | 200/244 |
| 5,904,592 A | * | 5/1999 | Baran | H02B 1/052 |
| | | | | 361/627 |
| 6,034,584 A | * | 3/2000 | Hilfiker | H01H 11/0031 |
| | | | | 335/132 |
| 6,038,130 A | * | 3/2000 | Boeck | H01R 9/2675 |
| | | | | 361/729 |
| 6,172,875 B1 | * | 1/2001 | Suzuki | G06F 1/183 |
| | | | | 361/679.4 |
| 6,618,248 B1 | | 9/2003 | Dalheimer | |
| 6,790,050 B1 | | 9/2004 | Roth-Stielow et al. | |
| 2002/0038981 A1 | * | 4/2002 | Brown | H05K 7/1471 |
| | | | | 307/125 |
| 2007/0246256 A1 | | 10/2007 | Eusterholz et al. | |
| 2016/0044214 A1 | | 2/2016 | Tsujikawa | |
| 2016/0079016 A1 | | 3/2016 | Matsuda | |

FOREIGN PATENT DOCUMENTS

| | | |
|---|---|---|
| DE | 202006006615 U1 | 9/2006 |
| DE | 102009044901 A1 | 5/2011 |
| DE | 102012103217 B3 | 8/2013 |
| EP | 1153534 A1 | 11/2001 |
| EP | 1681614 A2 | 7/2006 |
| RU | 2239865 C2 | 11/2004 |
| WO | WO 2014188558 A1 | 11/2014 |
| WO | WO 2014188855 A1 | 11/2014 |

OTHER PUBLICATIONS

Hartmut Wendt Hard- & Softwareentwicklung, "RaspiBox Open+ for model A+, B+, 2 B & 3 B: The DIN rail enclosure solution for Raspberry Pi", Dec. 19, 2005, pp. 1-5.

Anonymous: "RasPiBox Open—Duinocade, RasPiBox, Mini Arcade, EUzebox", Aug. 1, 2015 (Aug. 1, 2015), XP055381376.

* cited by examiner

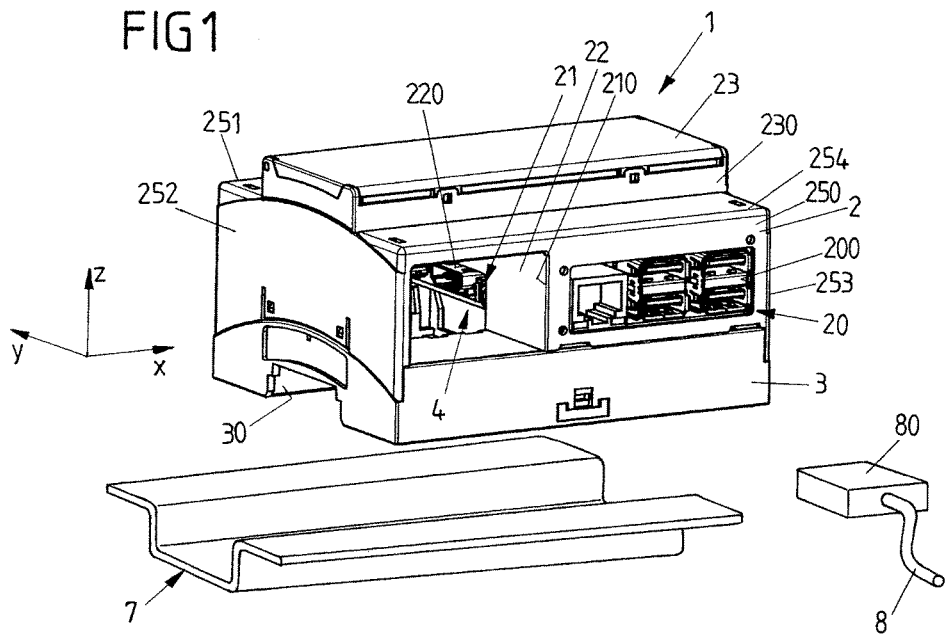
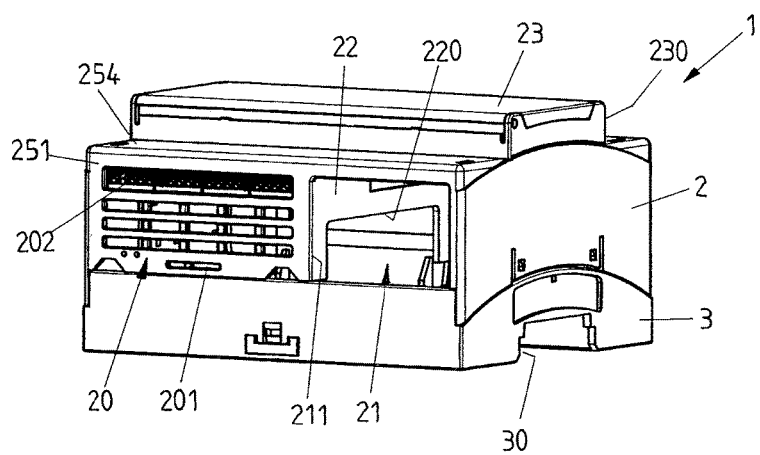

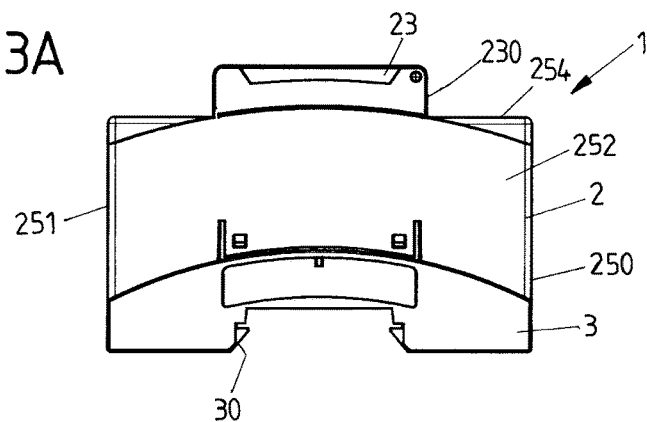
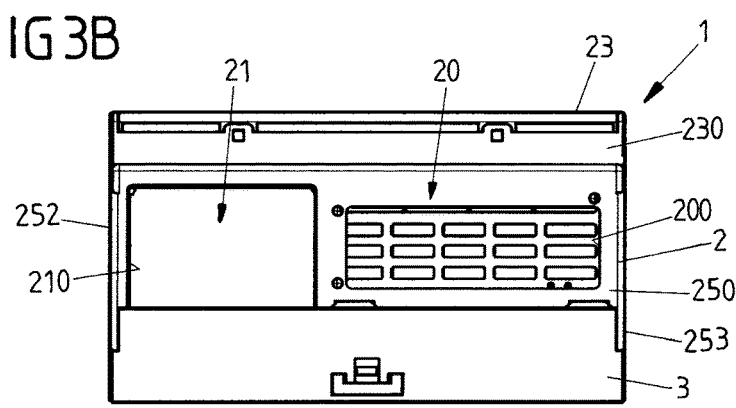
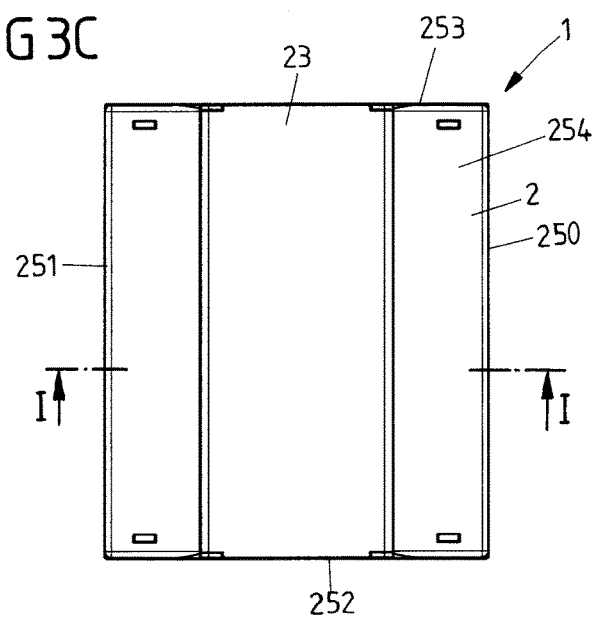

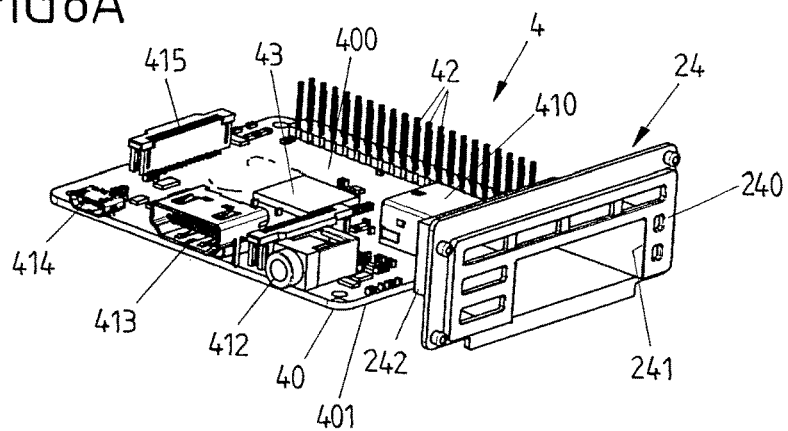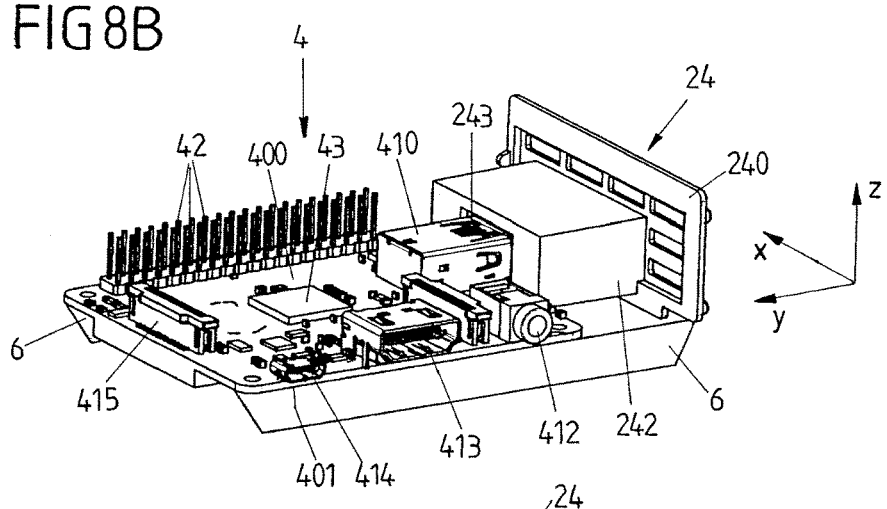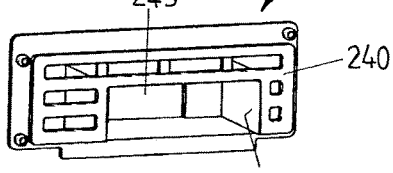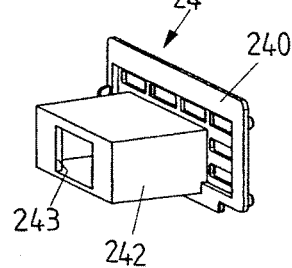

HOUSING MOUNTABLE ON A MOUNTING RAIL FOR RECEIVING AN ELECTRONICS MODULE

CROSS-REFERENCE TO PRIOR APPLICATIONS

Priority is claimed to German Patent Application No. DE 10 2016 101 409.5, filed on Jan. 27, 2016, the entire disclosure of which is hereby incorporated by reference.

FIELD

The invention relates to a housing mountable on a mounting rail.

BACKGROUND

A housing of this type comprises an upper housing part which has two side walls, extending longitudinally in a longitudinal direction and spaced apart in a transverse direction transverse to the longitudinal direction, and a receiving chamber, formed between the side walls, for receiving an electronics module. At least one of the side walls has a first opening, via which a first electrical line is connectable to a first port of the electronics module.

An electronics module of this type is for example a circuit board having one or more electronic components, for example electronic chips, attached thereto. An electronics module of this type may for example be a single-board computer, available for example under the trade name Raspberry Pi. A single-board computer (SBC for short) of this type is a computer system in which all major electronic components required for operating a computer system are assembled on a single circuit board, the network part typically being formed separately from the circuit board as an individual component. Single-board computers of this type are for example used by private users for hobby applications or else by commercial users, for example for control, measurement, regulation and monitoring functions in industry and research.

By means of a housing mountable on a mounting rail, an electronics module can be connected to a mounting rail and be combined together with other components, for example other electronic appliances or the like, to form an electrical system which can perform control, measurement, regulation or monitoring functions.

It is desirable for housings of this type to be compatible with conventional switch cabinet dimensions such as are specified in DIN EN 43880 (last edition 1988-12). This results in the difficulty that electronics modules for example in the form of single-board computers often have ports on different edges of a circuit board, in such a way that electrical lines are to be inserted at different edges of the circuit board from different directions, requiring that the electronics module be accessible from different sides. However, the housing receiving the electronics module should still be combinable with other housings, and remain capable of being arranged side-by-side with other housings without gaps for this purpose.

In a housing known from DE 10 2009 044 901 A1, an electronics module is received in a receiving chamber. The housing comprises a cover so as to provide access to the electronics module arranged in the housing.

A housing known from DE 20 2006 006 615 U1 is configured to receive a plurality of circuit boards.

DE 44 34 064 A1 discloses a housing in which a circuit board can be fastened via a circuit board holder.

SUMMARY

In an embodiment, the present invention provides a housing mountable on a mounting rail, comprising: an upper housing part which has two side walls, extending longitudinally in a longitudinal direction and spaced apart from one another in a transverse direction transverse to the longitudinal direction; and a receiving chamber, formed between the side walls, configured to receive an electronics module, at least one of the side walls having a first opening via which a first electrical line is connectable to a first port of the electronics module, wherein the upper housing part has a connection chamber which is offset in the longitudinal direction from the receiving chamber, is formed between the side walls, and is open to the receiving chamber such that a second electrical line is connectable to a second electrical port of the electronics module via the connection chamber.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 1 is a perspective view of an embodiment of a housing comprising an electronics module arranged therein;

FIG. 2 is another perspective view of the housing, without the electronics module arranged therein;

FIG. 3A is an end face view of the housing;

FIG. 3B is a side view of the housing;

FIG. 3C is a plan view of the housing;

FIG. 8A is a view of another embodiment of an electronics module of a smaller construction, together with an adapter part;

FIG. 8B is another perspective view of the electronics module according to FIG. 8A;

FIG. 9A is a separate view of the adapter part; and

FIG. 9B is a different view of the adapter part.

DETAILED DESCRIPTION

Figure 4:
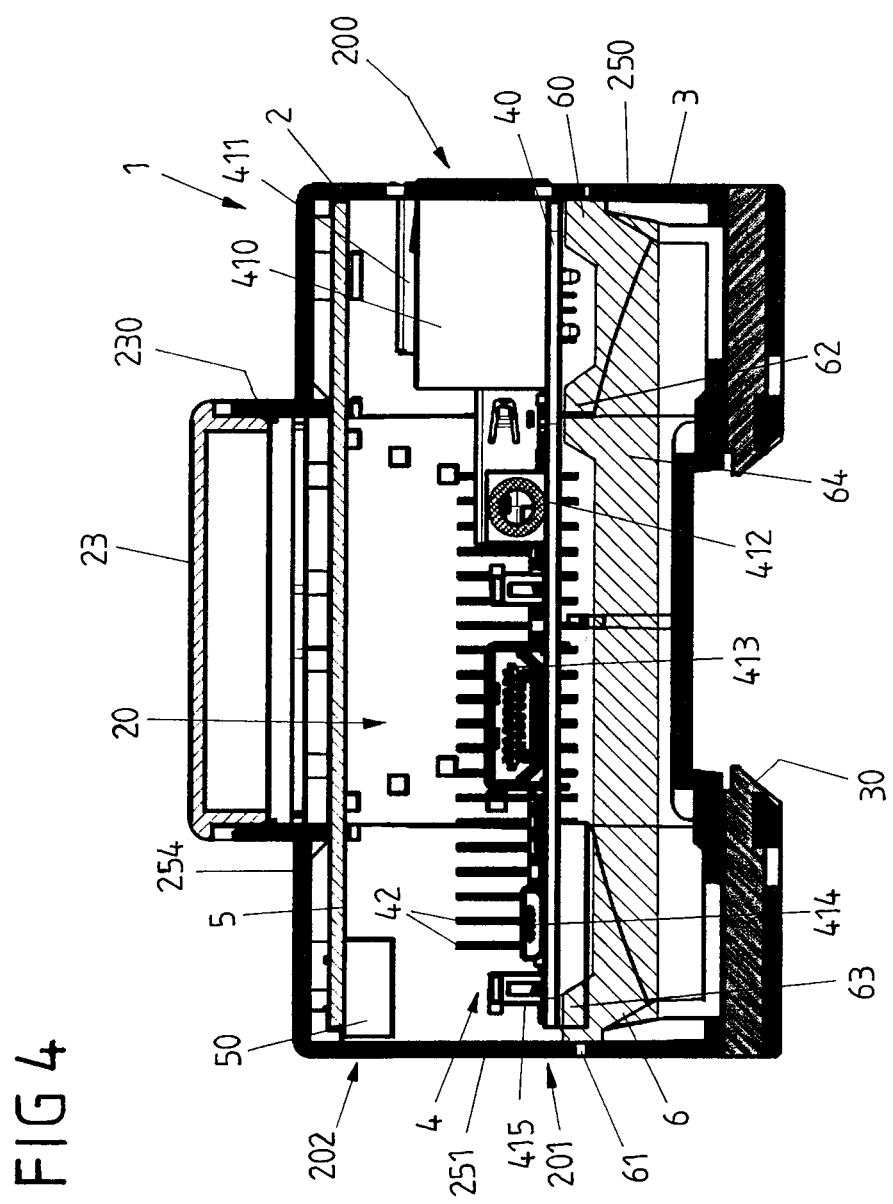
FIG. 4 is a sectional view along the line I-I according to FIG. 3C, with an electronics module arranged in the housing.

Accordingly, the upper housing part has a connection chamber which is offset in the longitudinal direction from the receiving chamber, is formed between the side walls, and is open to the receiving chamber in such a way that a second electrical line can be connected to a second electrical port of the electronics module via the connection chamber.

The housing is thus functionally divided in two, in that both a receiving chamber for receiving the electronics module and a connection chamber for connecting one or more electrical lines to ports of the electronics module are formed on the upper housing part. The electronics module can be inserted into the receiving chamber, and when in the assembled state the electronic component is enclosed in the receiving chamber. On the one hand, electrical lines may be connected via one or both of the side walls and openings formed therein to (first) ports of the electronics module. In addition, further electrical lines may be connected via the connection chamber to further (second) electrical ports of the electronics module, in such a way that ports on different sides of the electronics module are accessible in a flexible manner and make it possible to connect different lines.

The longitudinal direction in which the receiving chamber and the connection chamber are offset from one another may for example correspond to the longitudinal extension direction of the mounting rail. Different housings of different electronic appliances may be arranged side-by-side and mounted on the mounting rail in such a way that an electrical system is produced which can for example perform control, measurement, regulation or monitoring functions in an industrial facility or the like.

The side walls extend in parallel planes spanned by the longitudinal direction and a vertical direction perpendicular to the longitudinal direction and perpendicular to the transverse direction, in such way that electrical lines can readily be laid to the housing via the (first) openings in the side walls. However, because different housings are to be capable of being arranged side-by-side in the longitudinal direction, electrical lines cannot readily be guided to the electronics module in the longitudinal direction. For this purpose, the connection chamber is provided, which is offset from the receiving chamber in the longitudinal direction and thus provides access to the receiving chamber in the longitudinal direction. Via the connection chamber, an electrical line can be connected to a port, facing the connection chamber, of the electronics module, it being possible to guide electrical lines away from the housing via the receiving chamber, in such a way that the electrical lines do not prevent different housings from being arranged side-by-side on a mounting rail in the longitudinal direction.

The connection chamber is preferably open to the outside on at least one of the side walls. For this purpose, at least one of the side walls has a second opening, via which one (second) electrical line can be introduced into the connection chamber, in such a way that the (second) electrical line can be connected to the (second) port of the electronics module within the connection chamber.

As a result of the provision of the receiving chamber for receiving the electronics module and the connection chamber so as to provide space to connect an electrical line to the electronics module within the housing, the housing is functionally divided in two. In this context, it may be provided that the connection chamber is also structurally separated from the receiving chamber, for example in that a partition wall extending transversely to the longitudinal direction is provided between the connection chamber and the receiving chamber. So as to make it possible to connect an electrical line to a port of the electronics module from the connection chamber side, the partition wall has an opening via which the second electrical line can be brought into engagement with the associated port on the electronics module side, for example by means of a suitable plug-in connector.

The housing may for example have an upper housing part and additionally a lower housing part which can be assembled together with the upper housing part, said parts together enclosing the receiving chamber and the connection chamber. Whilst the upper housing part when the housing is mounted on a mounting rail is arranged on a side of the housing remote from the mounting rail, the lower housing part may for example have a fastening element via which the housing can be secured to the mounting rail. The mounting rail may for example be formed as a top-hat rail (having a top-hat-like shape in cross section). In this case, the fastening element of the lower housing part may for example have the shape of a recess, having locking elements arranged thereon via which the lower housing part can be latched to the mounting rail.

In an initial state, the upper housing part and the lower housing part may be separate from one another, in such a way that the electronics module can be mounted on the upper housing part and be enclosed in the housing by assembling the upper housing part together with the lower housing part. The upper housing part and the lower housing part may for example be intended for positive interconnection by way of suitable latch elements or the like. Alternatively, it is also conceivable and possible for example to screw the upper housing part to the lower housing part.

On a side remote from the lower housing part, the upper housing part may for example have a cover wall on which a movable cover is arranged. The cover may for example be opened so as to provide access to the receiving chamber and/or the connection chamber. Thus, by opening the cover, for example an electronics module within the receiving chamber can be accessed, it also for example being conceivable and possible to connect electrical lines to the electronics module from above by opening the cover and by way of an opening thus exposed in the housing.

In a further embodiment, the upper housing part may for example have two end walls extending transversely to the longitudinal direction, which are spaced apart from one another in the longitudinal direction and form end faces of the housing. The housing is thus—as seen in the longitudinal direction—defined by the end walls on both sides, creating a planar termination for the housing which makes it possible to combine the housing with other electronic appliances and to mount them so as to be arranged side-by-side on a mounting rail. Via the end walls, the housing can thus be combined with further devices without gaps, in such a way that a side-by-side arrangement of electronic appliances, terminal elements or the like can be provided on a mounting rail.

The dimensions of the housing, in particular measured in the longitudinal direction, may comply with the provisions of DIN EN 43880, in such a way that the housing is flexibly combinable with other components in accordance with DIN EN 43880 and in particular meets the width pattern specified in DIN EN 43880.

An electronic appliance comprises a housing of the above-described type and additionally an electronics module which is received in the receiving chamber of the housing and which may for example be formed as a single-board computer. In a single-board computer of this type, the major components required for operating a computer system are combined on a single circuit board, in such a way that a computer system is provided on a single circuit board. A single-board computer system of this type can for example perform control and automation functions in an industrial facility or the like.

The electronics module has for example a circuit board comprising an electronic component, for example an electronic chip, arranged thereon. The circuit board may for example comprise different ports, for example a network port (RJ45 or the like), a USB port, an HDMI port and/or a jack port, or also other ports, on different edges. Via the connection chamber, one or more electrical lines may be connected to (second) ports on an edge of the circuit board extending in the transverse direction.

The circuit board of the electronics module is to be inserted into the receiving chamber of the housing and, when the housing is assembled, is enclosed in the receiving chamber in such a way that the circuit board is held fixed in position in the receiving chamber. So as to provide a fixed, defined position of the circuit board within the receiving chamber, the circuit board may be connected to one or a plurality of cross members, which for example extend on the circuit board in the transverse direction, and each have one or more positive connection elements via which the circuit board can be secured relative to the housing in a positive fit.

The cross members may for example be connected to the circuit board at fastening points, for example by clipping the cross members to the circuit board in a positive fit. The positive fit elements may be formed at ends of the cross member, which elements for example engage in positive fit openings in the side walls of the upper housing part and thus secure the circuit board inside the receiving chamber in a positive fit. The positive fit openings in the side walls may for example be formed by recesses on lower edges of the side walls, the cross members being wedged between the upper housing part and the lower housing part by mounting the lower housing part on the upper housing part, in such way that the cross members and thus the circuit board are secured within the housing in a positive fit.

The housing can preferably be equipped with electronics modules of different sizes. So as to adapt the housing to different constructions, one or more different adapter parts may be provided, which serve to establish a transition between an opening in a side wall of the upper housing part and an associated port of the electronics module.

An adapter part of this type may for example have a box shape and may be mounted on an opening in a side wall. The adapter part comprises an outwardly open housing portion, which has on the base thereof a recessed adapter opening via which an electrical line can be connected to a port of the electronics module. The adapter part thus extends between the opening of the side wall and the associated port of the electronics module, in such a way that an electrical line can be inserted into the adapter part and can be electrically connected via the adapter part to the associated port of the electronics module.

In a further embodiment, a plurality of circuit boards may also be received within the receiving chamber. Thus, for example, a second circuit board comprising electronic components may be arranged within the receiving chamber, this second circuit board for example being offset in the vertical direction perpendicular to the circuit board of the electronics module, in such a way that the second circuit board and the first circuit board of the electronics module are arranged in mutually vertically offset planes.

The second circuit board may for example comprise plug-in connectors or the like, via which the first circuit board of the electronics module can be electrically contacted with the second circuit board. The second circuit board can be pre-installed within the housing, in such a way that when the electronics module is mounted on the upper housing part the contacts of the electronics module automatically enter connection with associated contacts of the second circuit board, and the electronics module is thus contacted with the second circuit board.

FIGS. 1 and 2 show an embodiment of a housing 1, which has an upper housing part 2 and a lower housing part 3 which can be assembled together with the upper housing part 2, and which can be mounted on a mounting rail 7 via a fastening element 30 on the lower face of the lower housing part 3.

The housing 1 serves to receive an electronics module 4, which may in particular be configured as a single-board computer, and (as is shown in different embodiments in FIGS. 6A, 6B and 8A, 8B) has a circuit board 40 which is received in a receiving chamber 20 within the housing 1. Via the housing 1, said electronics module 4 can be fastened to the mounting rail 7 and combined with other electronic appliances in that the housing 1 is arranged side-by-side with other electronic appliances in a longitudinal direction X and fastened to the mounting rail 7.

FIG. 3A to 3C are views of the housing 1 from different sides, and FIG. 4 is a sectional view through the housing 1 along the section line I-I of FIG. 3C.

Figure 5A:
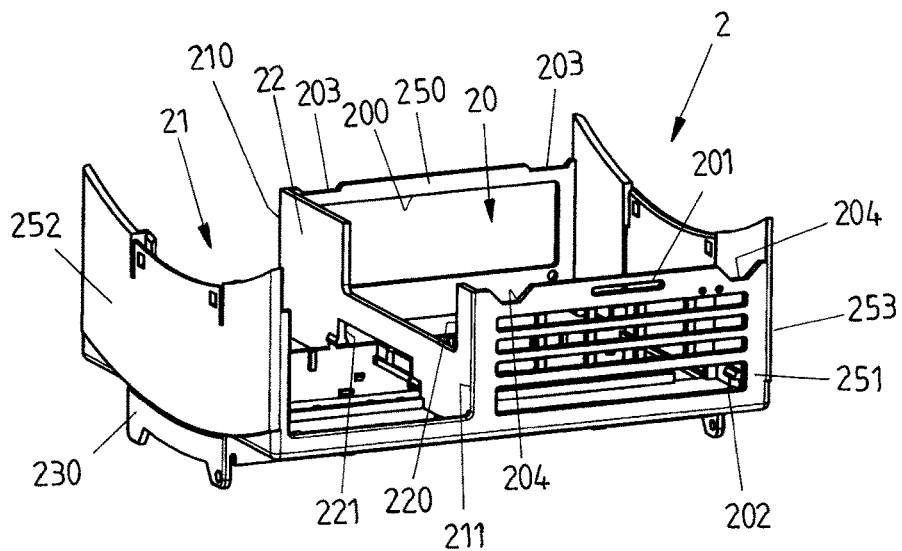
FIG. 5A is a perspective view of an upper housing part of the housing.
Figure 5B:
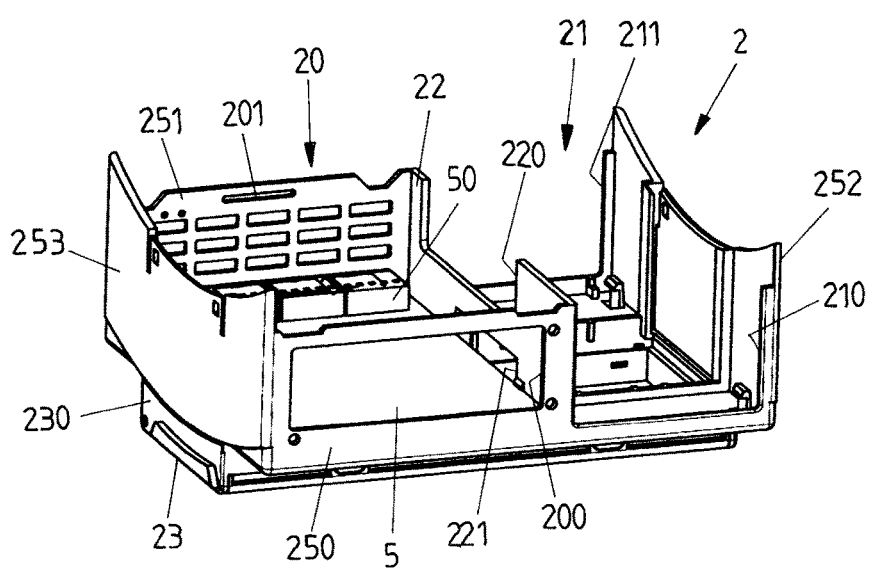
FIG. 5B is a different perspective view of the upper housing part, with a second circuit board arranged in a receiving chamber.
Figure 6A:
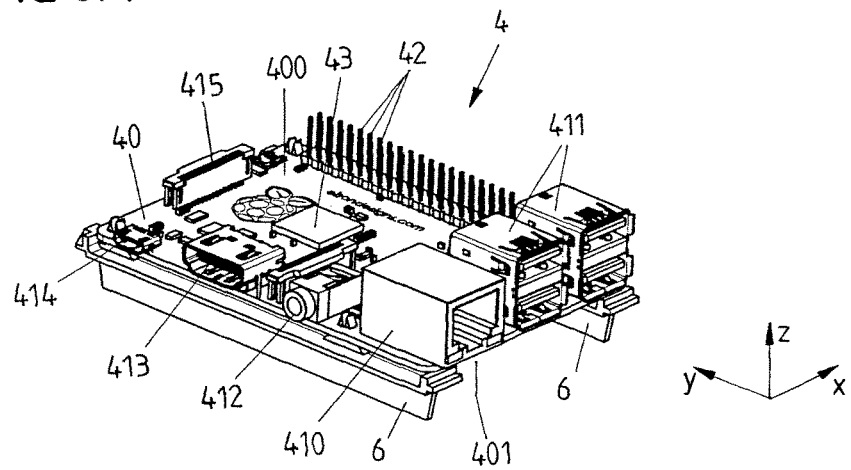
FIG. 6A is a view of an electronics module, in the form of a single-board computer, to be received in the housing.

FIG. 5A, 5B are separate views of the upper housing part 2, which is functionally divided in two in that it has a receiving chamber 20 for receiving the electronics module 4 and a connection chamber 21, which is offset from said receiving chamber 20 in the longitudinal direction X and via which the electrical lines can be connected to ports 412, 413, 414 on an edge of the electronics module 4 extending in a transverse direction Y (see FIG. 6A).

The upper housing part 2 has side walls 250, 251 between which the receiving chamber 20 and the connection chamber 21 are formed. The side walls 250, 251 extend in parallel planes, which are spanned by the longitudinal direction X and a vertical direction Z. At the end face, the upper housing part 2 is closed off by end walls 252, 253, which form end faces via which the housing can be mounted on further appliances without gaps so as to combine the housing 1 with other appliances on the mounting rail 7. At the upper face, the upper housing part 2 is closed off by a cover wall 254 (see FIG. 1), on which, via a head portion 230, a cover 23 is arranged which can be opened so as to provide access to the housing interior, and thus to the receiving chamber 20 and the connection chamber 21.

As can be seen from the embodiments of the electronics module 4 according to FIGS. 6A and 6B or 8A and 8B, the electronics module 4 has a plurality of ports 410-415, which are arranged on different edges of the circuit board 40 and are accessible from different faces of the electronics module 4. The ports 410-415 may for example provide a network port (RJ45, port 410), USB ports (ports 411), a jack port (port 412), an HDMI port (port 413), a mini-USB port (port 414) and a port for inserting a memory card, for example an SD card (port 415). In addition, ports may also be provided which are arranged on an upper face 400 of the circuit board 40 and are accessible from above.

To connect electrical lines 8 (see FIG. 1) to a port 410-415 of the electronics module 4, it is necessary to mount a plug-in connector 80 of the electrical line 8 on the side of the electronics module 4 on which the port 410-415 is arranged. For this purpose, openings 200, 201, via which the ports 410, 411, 415 are accessible at the lateral edges of the circuit board 40 extending in the longitudinal direction X, are formed in the side walls 250, 251, as can be seen from the views of the housing 1 in FIGS. 1 and 2.

In addition, via the connection chamber 21 of the housing 1, it is possible to connect electrical lines 8 to the ports 412, 413, 414 on the edge of the circuit board extending in the transverse direction Y. For this purpose, the connection chamber 21 is open to the outside via openings 210, 211 in the side walls 250, 251, in such a way that electrical lines 8 can be introduced into the connection chamber 21 via the side walls 250, 251. The connection chamber 21 is separated from the receiving chamber 20 via a partition wall 22, an opening 220 in the form of an aperture, via which the ports 412, 413, 414 on the transversely extending edge of the circuit board 40 are accessible, being provided in the partition wall 22, in such a way that within the connection chamber 21 electrical lines 8 can be connected to the ports 412, 413, 414 on the transversely extending edge of the circuit board 40.

Because the connection chamber 21 is offset from the receiving chamber 20 in the longitudinal direction X, electrical lines 8 can thus be laid to the edge of the circuit board 40 of the electronics module 4, which edge extends in the transverse direction Y, and to the ports 412, 413, 414 arranged thereon, it being possible to pass the electrical lines 8 out of the housing 1 via the openings 210, 211 in the side walls 250, 251 without the lines 8 protruding out via the end walls 252, 253. The housing 1 can thus readily be combined with other appliances, for example other electronic appliances or for example series terminals, without gaps and fastened to a mounting rail 7.

The electronics module 4, as shown in different embodiments in FIGS. 6A, 6B and 8A, 8B, may for example implement a single-board computer in which one or more electronic components 43 in the form of electronic chips are arranged on a circuit board 40. The electronics module 4 may for example be configured to perform control and automation functions in an industrial facility, and may be programmable accordingly and have a suitable operating system for this purpose.

The electronics module 4 is—in the assembled state of the housing 1—fully enclosed within the receiving chamber 20 of the housing and held therein. In a pre-assembly state, the upper housing part 2 and lower housing part 3 of the housing 1 are separate, in such a way that the electronics module 4 can be inserted into the receiving chamber 20 within the upper housing part 2.

Figure 7:
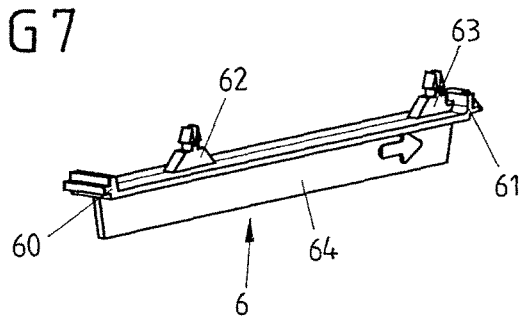
FIG. 7 is a view of a cross member to be connected to a circuit board of the electronics module for arranging the electronics module within the receiving chamber of the housing in a positive fit.

Two cross members 6 extending in the transverse direction Y are fastened to a lower face 401 of the circuit board 40, and serve to secure the electronics module 4 within the receiving chamber 20 in a positive fit. As can be seen from the separate view of a cross member 6 in FIG. 7, each cross member 6 comprises a connecting piece 64 extending in the transverse direction Y, which can be attached to defined fastening points of the circuit board 40 by way of fastening elements 62, 63 in the form of clip elements, so as to connect the cross member 6 to the circuit board 40. At each end 60, 61, the cross member 6 has a positive fit element, which serves to establish a positive fit between the electronics module 4 and the housing 1.

As can be seen from the views of the upper housing part 2 in FIGS. 5A and 5B, positive fit openings 203, 204 in the form of recesses are formed on lower-face edges of the side walls 250, 251, and serve to receive the positive fit elements on the ends 60, 61 of the cross member 6. If the electronics module 4 is inserted into the receiving chamber 20 of the upper housing part 2, the positive fit elements on one end 60 of the cross members 6 come into engagement with the positive fit openings 203 on the side wall 250, whilst the positive fit elements on the other, opposite end 61 of the cross members 6 come into engagement with the positive fit openings 204 on the side wall 251. The electronics module 4 thus takes on a defined position within the receiving chamber 20 relative to the upper housing part 2, and as a result of the lower housing part 3 being mounted on the upper housing part 2 the electronics module 4 is wedged within the receiving chamber 20 by way of the cross member 6, in such a way that the electronics module 4 is held in the receiving chamber 20 in a positive fit.

The lower housing part 3 may be connected to the upper housing part 2 in a positive fit, for example. For example, the lower housing part 3 may be latched to the upper housing part 2, it being possible to configure this connection to be releasable, in such a way that, for example by using a suitable tool (such as a screwdriver), the latching between the lower housing part 3 and the upper housing part 2 can be released, so as to disassemble the housing 1.

As can be seen in particular from FIG. 5B, a further, second circuit board 5 comprising additional electronic components may be received within the receiving chamber 20 of the upper housing part 2. The circuit board 5 extends in a plane spanned by the longitudinal direction X and the transverse direction Y, and is offset from the circuit board 40 of the electronics module 4 in the vertical direction Z (when the electronics module is inserted into the receiving chamber 20).

Ports 50, which are accessible via an opening 202 in the side wall 251 of the upper housing part 2, may be arranged on the additional circuit board 5. Other ports on a transverse edge of the circuit board 50 may be accessible via an opening 221 in the separating wall 22 between the receiving chamber 20 and the connection chamber 21.

Suitable plug-in connectors, which establish electrical contact between the circuit board 5 and the contacts 42 on the upper face 400 of the circuit board 40 of the electronics module 4 when the electronics module 4 is inserted into the receiving chamber 20, may be provided on the circuit board 5. This electrical contact may take place automatically when the electronics module 4 is inserted into the receiving chamber 20. The electronics module 4 and electronic components of the circuit board 5 can thus cooperate electrically, for example so as to perform control or automation functions.

The housing 1 may be suitable for receiving different electronics modules 4 having different dimensions. Thus, as can be seen from the different embodiments of the electronics modules 4 according to FIGS. 6A, 6B and 8A, 8B, the circuit boards 40 of the electronics module 4 may be of different sizes. In that uniform cross members 6 are mounted on the lower face 401 of the circuit board 40 in question, and for this purpose the circuit boards 40 have defined, uniform fastening points for engaging the fastening elements 62, 63, the electronics modules 4 can be received within the receiving chamber 20 in a uniform manner, by way of the cross members 6, and secured therein in a positive fit.

Figure 6B:
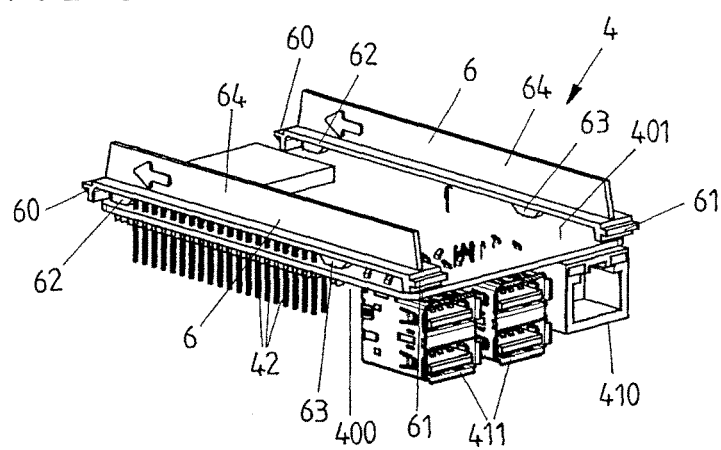
FIG. 6B shows the electronics module according to FIG. 6A from below.

In the embodiment according to FIG. 8A, 8B, the circuit board 40 of the electronics module 4 is of a shorter length, by comparison with the embodiment according to FIG. 6A, 6B, in the transverse direction Y. As is schematically indicated in FIG. 8B, the cross members 6 project beyond the circuit board 40 in the transverse direction Y, in such a way that the circuit board 40 can be secured within the receiving chamber 20 in a positive fit by way of the cross members 6.

So as to make it possible to connect an electrical line 8 to a port 410, which is assigned to the side wall 250 of the upper housing part 2 and is accessible via the opening 200, but which is now offset back from the opening 200 as a result of the smaller dimensions of the circuit board 40, an adapter part 24 is provided, which can be attached to the opening 200 and covers the opening 200 at least in part with a screen 240. The adapter part 24 comprises a housing portion 242 which projects into the receiving chamber 20 and which is open to the outside via an opening 241 and has a box shape. On a base of this housing portion 242, an adapter opening 243 is formed, in which the port 410 engages, in such a way that an electrical line can be introduced into the housing portion 242 and plugged into the port 410.

Different adapter parts 24 may be provided for different constructions of electronics modules 4. By way of the adapter parts 24, in particular ports 410 of the electronics module 4 which are offset back from the side walls 250, 251 can be made accessible in a simple manner, in such a way that a user can insert an electrical line 8 at the port 410 in an uncomplicated manner.

By mounting the housing 1 on the mounting rail 7, an electronics module 4 can be fastened to the mounting rail 7. A bus system, which can contact a suitable connection means on the lower housing part 3 of the housing 1 by mounting the housing 1, may be provided on the mounting rail 7, in such a way that the electronics module 4 can also be connected to the bus system via the housing 1. As a result, a communication connection can be established between the electronics module 4 within the housing 1 and other electronic appliances which are arranged on the mounting rail 7 or otherwise connected to the bus system of the mounting rail 7.

The concept underlying the invention is not limited to the above embodiments, but can also in principle be implemented in a completely different manner.

Thus, in principle electronics modules of a completely different type may be received within the housing. In particular, the housing is not limited to receiving electronics modules in the form of single-board computers.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

1 Housing
2 Upper housing part
20 Receiving chamber
200-202 Opening
203, 204 Positive fit opening
21 Connection chamber
210, 211 Opening
22 Partition wall
220, 221 Opening
23 Cover
230 Head region
24 Adapter part
240 Screen
241 Opening
242 Housing portion
243 Adapter opening
250, 251 Side walls
252, 253 End wall
254 Cover wall
3 Lower housing part
30 Fastening means
4 Electronic appliance
40 Circuit board
400 Upper face
401 Lower face
410-415 Ports
42 Contacts
43 Chip
5 Circuit board
50 Ports
6 Cross member
60, 61 End (positive fit element)
62, 63 Fastening element
64 Connecting piece
7 Mounting rail
8 Electrical line
80 Connection
X, Y, Z Direction

The invention claimed is:

1. A housing mountable on a mounting rail, comprising:
an upper housing part which has two side walls, extending longitudinally in a longitudinal direction and spaced apart from one another in a transverse direction transverse to the longitudinal direction; and
a receiving chamber, formed between the side walls, configured to receive an electronics module, at least one of the side walls having a first opening via which a first electrical line is connectable to a first port of the electronics module,
wherein the upper housing part has a connection chamber which is offset in the longitudinal direction from the receiving chamber, is formed between the side walls, and is open to the receiving chamber such that a second electrical line is connectable to a second electrical port of the electronics module via the connection chamber, and
wherein the connection chamber is separated from the receiving chamber by a partition wall extending transversely to the longitudinal direction, the partition wall having an opening via which the second electrical line is connectable to the second port of the electronics module.

2. The housing according to claim 1, wherein at least one of the side walls has a second opening, via which the second electrical line is insertable into the connection chamber.

3. The housing according to claim 1, further comprising a lower housing part which is configured to be assembled together with the upper housing part and which has a fastening element via which the housing can be fastened to a mounting rail extending in the longitudinal direction.

4. The housing according to claim 3, wherein the lower housing part is latchable to the upper housing part in a positive fit.

5. The housing according to claim 1, wherein the upper housing part has a cover on a cover wall connecting the side walls, which cover is configured to be opened for access to the receiving chamber and/or the connection chamber.

6. The housing according to claim 1, wherein the upper housing part has two end walls extending transversely to the longitudinal direction, which are spaced apart in the longitudinal direction and form end faces of the housing, on each of which a further housing is mountable so as to arrange a plurality of housings side-by-side in the longitudinal direction.

7. An electronic appliance, comprising a housing according to claim 1 and the electronics module received in the receiving chamber of the housing.

8. The electronic appliance according to claim 7, wherein the electronics module implements a single-board computer.

9. The electronic appliance according to claim 7, wherein the electronics module has a circuit board comprising an electronic component arranged thereon.

10. The electronic appliance according to claim 9, wherein the first port is arranged on an edge of the circuit board extending in the longitudinal direction and the second port is arranged on a second edge of the circuit board extending in the transverse direction.

11. The electronic appliance according to claim 9, wherein at least one cross member is arranged on the circuit board, and has at least one positive fit element configured to secure the circuit board to the housing in a positive fit.

12. The electronic appliance according to claim 11, wherein the at least one cross member extends on the circuit board in the transverse direction.

13. The electronic appliance according to claim 11, wherein the upper housing part has, on at least one of the side walls, a positive fit opening configured to receive the positive fit element of the at least one cross member.

14. The electronic appliance according to claim 11, wherein when the housing is assembled the at least one cross member is held in a positive fit between the upper housing part and a lower housing part mounted on the upper housing part.

15. The electronic appliance according to claim 7, further comprising an adapter part which is connected to one of the side walls, connects to the first opening, and has a housing portion projecting into the receiving chamber and having an adapter opening, which is recessed with respect to the first opening and via which the first electrical line is connectable to the first port.

16. The electronic appliance according to claim 9, wherein a second circuit board is arranged within the receiving chamber and is offset from the electronics module in a vertical direction perpendicular to the longitudinal direction and perpendicular to the transverse direction.

17. The electronic appliance according to claim 16, wherein the second circuit board is electrically contacted with the electronics module.

18. An electronic appliance, comprising:
a housing mountable on a mounting rail, the housing comprising:
an upper housing part which has two side walls, extending longitudinally in a longitudinal direction and spaced apart from one another in a transverse direction transverse to the longitudinal direction; and
a receiving chamber, formed between the side walls, configured to receive an electronics module, at least one of the side walls having a first opening via which a first electrical line is connectable to a first port of the electronics module, and
an adapter part which is connected to one of the side walls, connects to the first opening, and has a housing portion projecting into the receiving chamber and having an adapter opening, which is recessed with respect to the first opening and via which the first electrical line is connectable to the first port,
wherein the upper housing part has a connection chamber which is offset in the longitudinal direction from the receiving chamber, is formed between the side walls, and is open to the receiving chamber such that a second electrical line is connectable to a second electrical port of the electronics module via the connection chamber, and
wherein the electronics module is received in the receiving chamber of the housing.

19. An electronic appliance, comprising:
a housing mountable on a mounting rail, the housing comprising:
an upper housing part which has two side walls, extending longitudinally in a longitudinal direction and spaced apart from one another in a transverse direction transverse to the longitudinal direction; and
a receiving chamber, formed between the side walls, configured to receive an electronics module, at least one of the side walls having a first opening via which a first electrical line is connectable to a first port of the electronics module, and
wherein the upper housing part has a connection chamber which is offset in the longitudinal direction from the receiving chamber, is formed between the side walls, and is open to the receiving chamber such that a second electrical line is connectable to a second electrical port of the electronics module via the connection chamber,
wherein the electronics module is received in the receiving chamber of the housing,
wherein the electronics module has a circuit board comprising an electronic component arranged thereon, and
wherein a second circuit board is arranged within the receiving chamber and is offset from the electronics module in a vertical direction perpendicular to the longitudinal direction and perpendicular to the transverse direction.

20. The electronic appliance according to claim 19, wherein the second circuit board is electrically contacted with the electronics module.

* * * * *